(12) United States Patent
Iwasaki

(10) Patent No.: US 6,381,134 B2
(45) Date of Patent: Apr. 30, 2002

(54) FORCED VENTILATION SYSTEM FOR ELECTRIC INSTRUMENTS

(75) Inventor: Shizuo Iwasaki, Tokorozawa (JP)

(73) Assignee: TEAC Corporation, Tokyo (JP)

( * ) Notice: Subject to any disclaimer, the term of this patent is extended or adjusted under 35 U.S.C. 154(b) by 0 days.

(21) Appl. No.: 09/735,700

(22) Filed: Dec. 13, 2000

(30) Foreign Application Priority Data

Dec. 24, 1999 (JP) ............................................ 11-366082
Sep. 22, 2000 (JP) ............................................ 12-289511

(51) Int. Cl.⁷ ................................................ H05K 7/20
(52) U.S. Cl. ...................... 361/695; 361/690; 361/692; 361/694; 174/16.1; 165/80.1; 165/104.33; 165/122
(58) Field of Search ................................ 361/690, 694, 361/695, 704; 174/16.1, 16.3; 165/80.3, 104.33, 122, 185; 454/184

(56) References Cited

U.S. PATENT DOCUMENTS

| | | | |
|---|---|---|---|
| 4,901,200 A | * | 2/1990 | Mazura ........................ 361/678 |
| 5,663,868 A | * | 9/1997 | Stalley ........................ 361/695 |
| 5,978,217 A | * | 11/1999 | Kerrigan et al. ............. 361/694 |
| 5,995,368 A | * | 11/1999 | Lee et al. .................... 361/695 |
| 6,034,870 A | * | 3/2000 | Osborn et al. ............... 361/690 |
| 6,105,875 A | * | 8/2000 | LaGrotta et al. ........... 165/80.3 |
| 6,151,212 A | * | 11/2000 | Schwenk et al. ........... 361/695 |

* cited by examiner

*Primary Examiner*—Leo P. Picard
*Assistant Examiner*—Boris L. Chervinsky
(74) *Attorney, Agent, or Firm*—Woodcock Washburn LLP

(57) ABSTRACT

An audio system component is disclosed which has a boxlike casing partitioned into an air intake passageway extending along one side of the casing, an exhaust passageway extending along the other side, and a circuit chamber between the two passageways. Both passageways are open rearwardly of the casing. A cooling fan is mounted in the circuit chamber for causing airflow from the intake to the exhaust passageway through the circuit chamber. The electric circuitry of the instrument, possibly including electronic components that need cooling, is housed in the circuit chamber so as to be cooled by the airflow. The circuitry has terminals arranged on the back of the casing and between the open ends of the air passageways.

6 Claims, 5 Drawing Sheets

FORCED VENTILATION SYSTEM FOR ELECTRIC INSTRUMENTS

BACKGROUND OF THE INVENTION

This invention relates to some improvements in a forced ventilation system for those electric instruments which have electric circuit means that need ventilation, such as semiconductor devices on printed circuit boards, or to such an electric instrument incorporating the improved forced ventilation system.

Electric instruments with a generally boxlike casing have been known and used extensively which have an exhaust fan mounted outside the casing. The air heated by the electronic devices within the casing is drawn by the fan and forced out of the casing in order to keep the devices at operable temperatures.

Being required to be least conspicuous, the fan has usually been mounted on the back of the casing. This fan location has brought about some inconveniences. First, in cases where a multiplicity of terminals are to be arranged on the back of the casing, the fan with its relatively large space requirement has imposed limits upon the latitude of terminal arrangement. Another pronounced inconvenience has been the noise produced by the more or less exposed fan.

There are additional considerations that must enter into the design of a well-ventilated electric instrument, particularly its casing. There must be an optimum airflow through the interior of the casing for most efficient cooling of the components housed therein. The constituent parts of the casing, well designed to assure such airflow, must, moreover, not add substantially to the manufacturing costs of the instrument and must lend themselves to ready assemblage.

SUMMARY OF THE INVENTION

The present invention has it as an object to provide a well ventilated electric instrument having a cooling fan incorporated therein so as not to interfere in any way with a desired arrangement of terminals or the like on its casing.

Another object of the invention is to reduce noise production by the fan to a minimum.

Still another object of the invention is to assure optimum airflow through the interior of the casing for most efficient cooling of the components housed therein.

A further object of the invention is to facilitate the manufacture and assemblage of the instrument that accomplishes all the foregoing objects.

Stated briefly, the present invention concerns a ventilated electric instrument comprising a casing having formed therein an air intake port and an exhaust port. A fan is mounted interiorly of the casing for causing airflow therethrough from the intake port to the exhaust port. Electronic circuit means are mounted interiorly of the casing and positioned to be cooled by the airflow, and terminal means are mounted exteriorly of the casing and electrically connected to the electronic circuit means.

Thus, with the fan mounted inside the casing, and preferably away from the back of the casing, terminals or the like can be arranged over a greater area on the casing back, in an ideal pattern or in a greater number than if the fan were mounted to the casing back. Noise production by the fan is also reduced to a minimum.

According to another feature of the invention, the casing has its interior partitioned into an air intake passageway extending along one side of the casing, an exhaust passageway extending along the other side of the casing, and a circuit chamber between the intake and the exhaust passageways. The electric circuit means are mounted in the circuit chamber.

Preferably, both air passageways are open rearwardly of the casing to the atmosphere and closed at their front ends, besides being open to the circuit chamber via inflow and outflow openings in the partitions. These openings in the partitions may be situated closer to the closed front ends, than to the open ends, of the air passageways.

Lying in the circuit chamber, the fan is mounted to the partition bounding the intake passageway in one embodiment of the invention, and to the other partition bounding the exhaust passageway in another. Either way, ambient air is drawn into the circuit chamber via the intake passageway on one side of the casing and exhausted therefrom via the exhaust passageway on the other side of the casing.

The electric circuit means will be cooled most efficiently by being positioned in the flow path of the air through the circuit chamber. The casing itself will also be cooled efficiently as the air streams into the circuit chamber not directly but via the elongate intake passageway and flows out not directly but via the elongate exhaust passageway.

No less significant advantage accruing from the provision of the intake and exhaust passageways is that the circuit chamber is completely closed except for the openings in the partitions. The fan will therefore present little or no noise problem.

According to a further feature of the invention, the casing is constituted of two parts which are designed for ease of fabrication and assemblage and which, moreover, are well calculated to realize all the foregoing features and advantages of the invention. The two parts of the casing are a casing bottom part substantially in the shape of an open-top box, and a casing top part substantially in the shape of an inverted U as seen in the depth direction of the casing. Both casing parts are manufacturable by bending required parts of sheet-metal punchings, and assemblable by interengaging them and fastening them with a minimal number of screws or the like.

The above and other objects, features and advantages of the invention and the manner of realizing them will become more apparent, and the invention itself will best be understood, from the following description taken together with the attached drawings showing the preferred embodiments of the invention.

DESCRIPTION OF THE PREFERRED EMBODIMENTS

Figure 1:
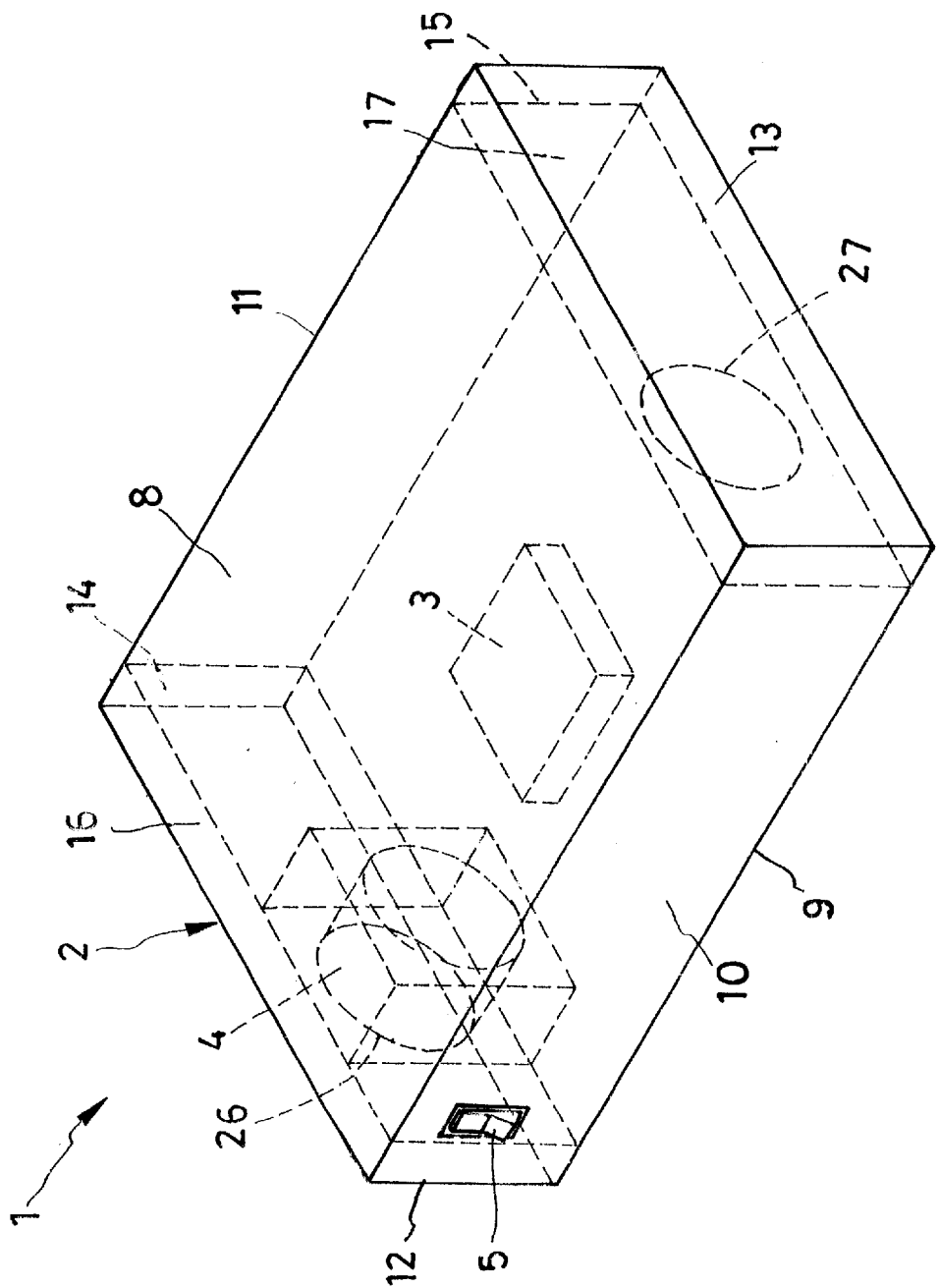
FIG. 1 is a perspective view of an example of ventilated electric instrument embodying the principles of the present invention, the instrument being herein shown as seen from its front.

The invention will now be described in detail as embodied in a component in a component audio system for interconnection and signal relaying of the various other components. As will be understood from both FIGS. 1 and 2, the exemplified electric instrument 1 broadly comprises a casing 2 having electric circuit means 3 housed therein, a cooling fan 4 mounted interiorly of the casing, a power switch 5 on one face of the casing, and a set of terminals 6 and power outlets or receptacles 7 on the opposite face of the casing. The casing 2 is pictured in both FIGS. 1 and 2 with the thickness of the sheet metal of which the casing is made, disregarded.

Although not shown in detail because of irrelevance to the invention, the electric circuit means 3 are understood to have semiconductor devices, capacitors, resistors and so forth mounted on a printed circuit board. Such circuit means are electrically connected to the terminals 6. The cooling fan 4 is electrically connected to a power supply, not shown, via the power switch 5, so that the fan starts working automatically as the instrument 1 is switched on. The receptacles 7 are also connected to the unshown power supply, either directly or via the power switch 5, for powering other system components.

FIG. 1 depicts the instrument 1 in the correct attitude in which it is to be put to use. The directional terms such as "front" and "rear," "top" and "bottom," and "righthand" and "lefthand" will be used hereinafter in this specification in reference to this attitude of the instrument in mind, unless otherwise specified.

Figure 2:
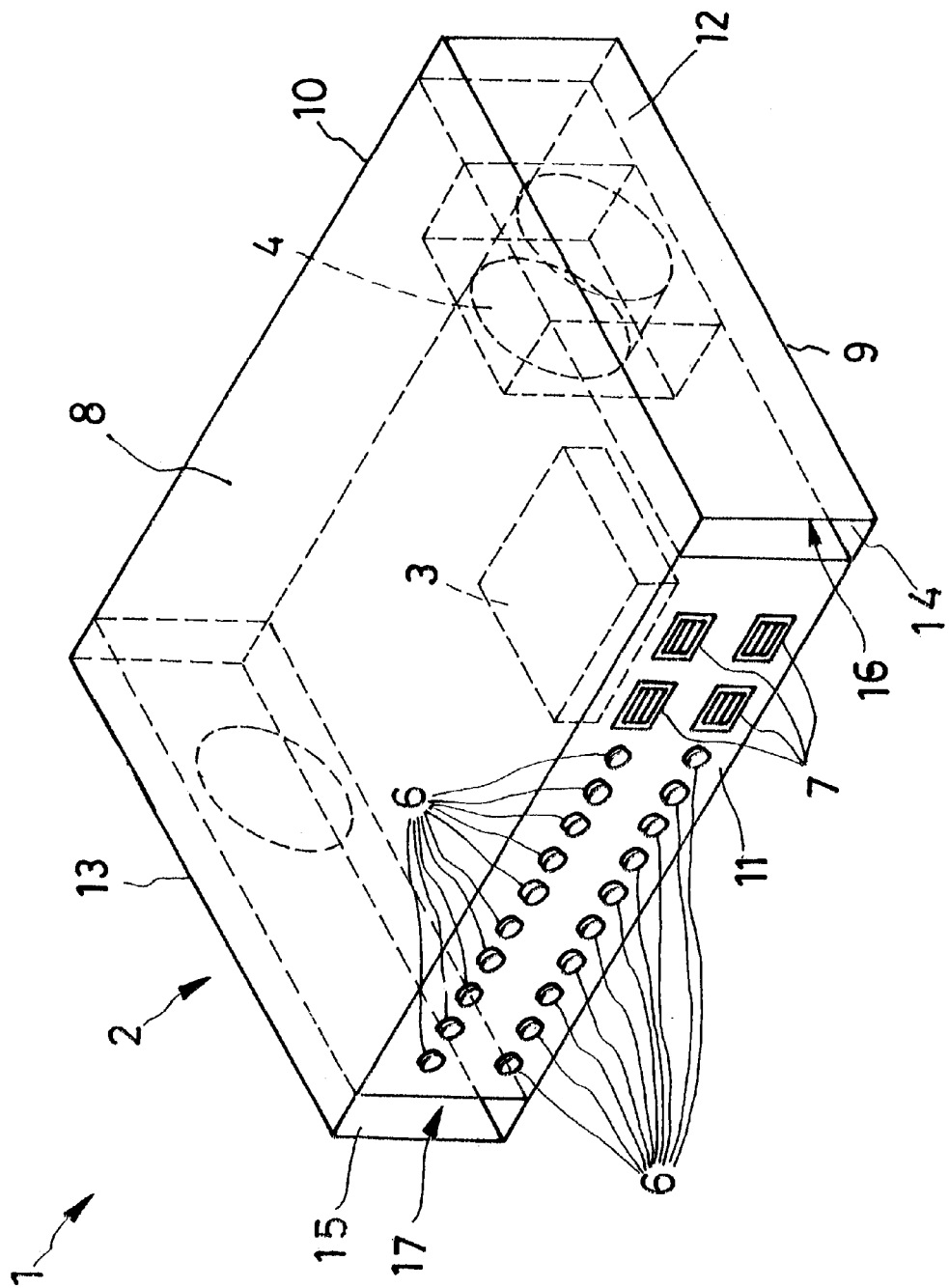
FIG. 2 is a view similar to FIG. 1 except that the instrument is shown as seen from its rear.
Figure 3:
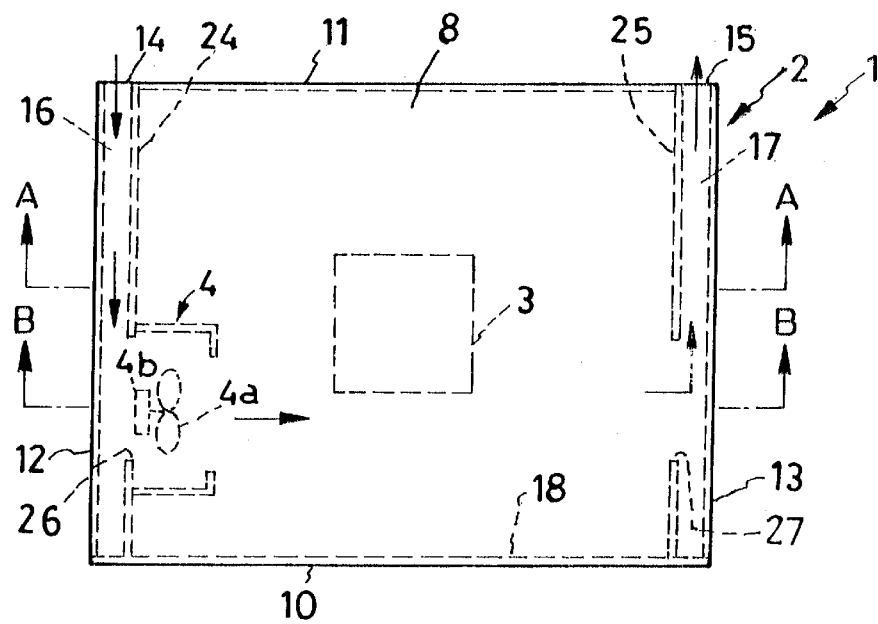
FIG. 3 is a top plan of the FIG. 1 instrument.
Figure 4:
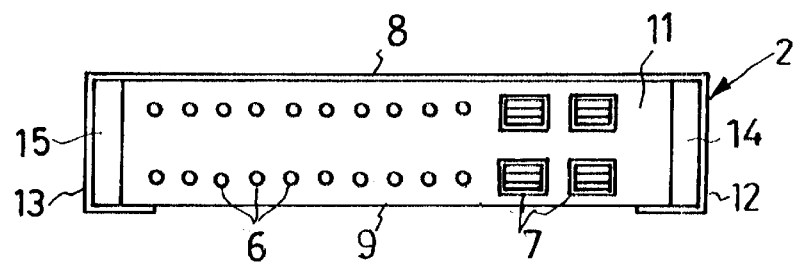
FIG. 4 is a rear elevation of the FIG. 1 instrument.
Figure 5:
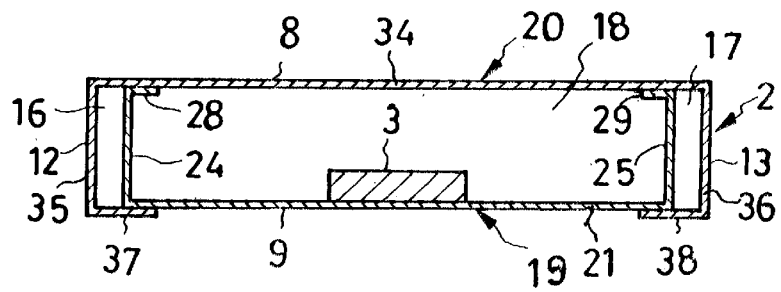
FIG. 5 is a vertical section through the FIG. 1 instrument, taken along the line A—A in FIG. 3.
Figure 6:
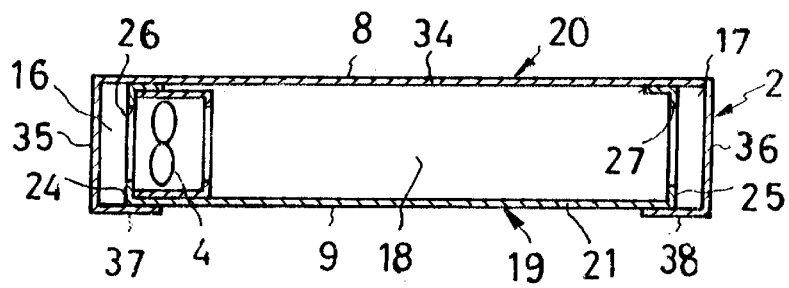
FIG. 6 is another vertical section through the FIG. 1 instrument, taken along the line B—B in FIG. 3.

Thus, as will be noted from all of FIGS. 1–6, the casing 2 is of relatively flat, boxlike shape having a relatively broad top 8, a bottom 9 of the same shape and size as the top, a front 10 of a greater horizontal dimension than a vertical, with the power switch 5 adjacent its lefthand end, a back 11 parallel to the front, with the terminals 6 and 7 arranged intermediate the opposite ends thereof, a lefthand side 12 which is also elongated horizontally but to a somewhat lesser extent than are the front and the back, and a righthand side 13 of the same shape and size as the lefthand side. The terminals 6 on the back 11 of the casing 2 are shown in FIGS. 2 and 4 as pin connector halves, with which the other connector halves, not shown, are to be engaged for connection of other system components.

Formed at the opposite ends of the back 11 are a slotlike air intake port 14 and exhaust port 15. The terminal pins 6 and receptacles 7 are disposed between these ports 14 and 15.

Perhaps as best revealed by FIG. 3, the interior of the casing 2 is divided into an air intake passageway 16 extending along the lefthand side 12 of the casing, an exhaust passageway 17 extending along the righthand side 13 of the casing, and a circuit chamber 18 between these passageways for accommodating the electric circuit means 3. The intake passageway 16 is open rearwardly through the intake port 14 and has its front end closed. The exhaust passageway 17 is likewise open rearwardly through the exhaust port 15 and has its front end closed. The circuit chamber 18 is completely enclosed except for air inflow and outflow openings to be set forth presently.

Figure 7:
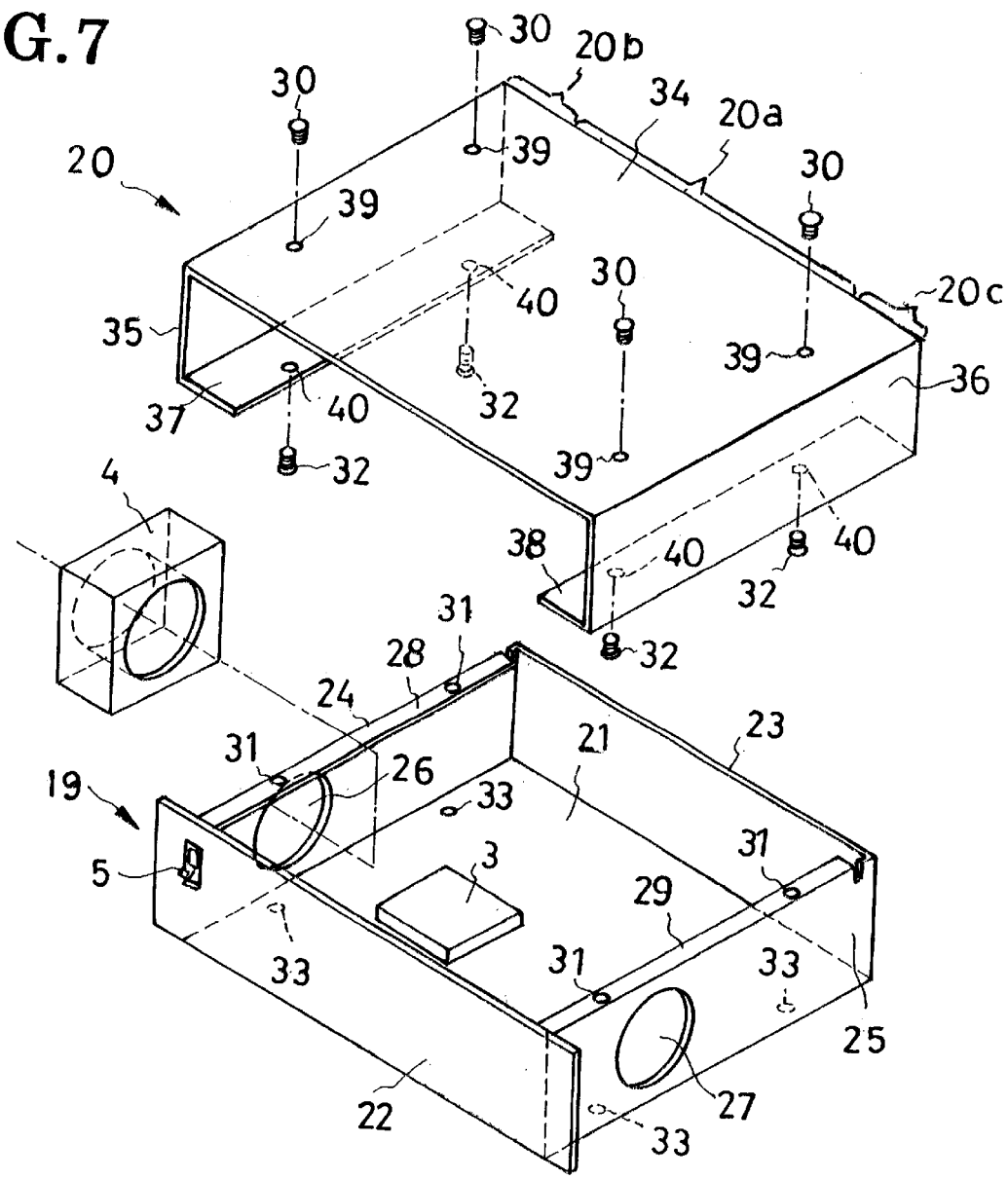
FIG. 7 is an exploded perspective view of the FIG. 1 instrument, showing in particular the detailed constructions of the top part and bottom part of the casing.

Preferably, and as shown in exploded perspective in FIG. 7, the casing 2, having its interior partitioned into three sections as above, should take in practice the form of a combination of a bottom part 19 and a top part 20. The casing bottom part 19 is substantially in the shape of an open-top box. The casing top part 20 is in the shape of an inverted U as seen in front or rear elevation, closing the open top of the casing bottom part 19. These casing parts 19 and 20 are well calculated to permit fabrication by simple bending of sheet-metal punchings and, further, assemblage with use of a minimum number of screws or like fastener elements, as will become better understood as the description progresses.

More specifically, the casing bottom part 19 is a one-piece construction of a bottom panel 21, a front panel 22, a rear panel 23, and a pair of partition panels 24 and 25. The bottom panel 21 is of rectangular shape, and the other panels 22, 23, 24 and 25 are all bent right-angularly up from the four sides of the bottom panel. Constituting a major part, not all, of the bottom 9 of the FIGS. 1–6 casing 2, the bottom panel 21 is shown to have the electric circuit means 3 mounted approximately centrally thereon.

The front panel 22 of the casing bottom part 19, forming the front 10 of the FIGS. 1–6 casing 2, is shown with the power switch 5 thereon. This front panel 22 is of greater horizontal dimension than the rear panel 23 of the body part 19, or the distance between the pair of partition panels 24 and 25, having a pair of opposite end portions extending beyond these side panels for closing the front ends of the air passageways 16 and 17, shown for example in FIG. 3, which are to be defined by the casing bottom part 19 and casing top part 20 when these are put together in a manner yet to be described.

The rear panel 23 of the casing bottom part 19 provides the back 11, FIG. 2, of the casing 2. Although the rear panel 23 is shown as a blank piece of sheet metal in FIG. 7, it is understood that the terminal pins 6 and receptacles 7 are to be provided on this rear panel, which therefore is in need of perforation for mounting such means.

The pair of partition panels 24 and 25 of the casing bottom part 19 are opposite each other and at right angles with the front panel 22 and rear panel 23. As indicated in FIG. 3, the lefthand partition panel 24 serves as the partition between the air intake passageway 16 and the circuit chamber 18 of the FIGS. 1–6 casing 2 and the righthand partition panel 25 as the partition between the air exhaust passageway 17 and the circuit chamber 18.

With reference to both FIGS. 3 and 7, an opening 26 of circular shape is cut in the lefthand partition panel 24 for air inflow from the intake passageway 16 into the circuit chamber 18, and another similar opening 27 in the righthand partition panel 24 for air outflow from the circuit chamber 18 into the exhaust passageway 17. It will be noted that both openings 26 and 27 are situated closer to the front of the casing 2, where the passageways 16 and 17 are closed, than to the rear of the casing, where they are open, for most efficient cooling of the entire casing and its interior, not to mention the electric circuit means 3 in the circuit chamber 18.

FIG. 7 shows flanges 28 and 29 bent right-angularly from the tops of the partition panels 24 and 25, respectively, and extending toward each other. A plurality of, two in the illustrated embodiment, tapped holes 31 are formed in each top flange 28 or 29, for use in screwing the cover part 20 to the body part 19. Additional tapped holes are formed at 33 in the bottom panel 21 also for use in fastening the cover part to the body part.

The casing top part 20 is a one-piece construction of a top panel 34, a pair of opposite side panels 35 and 36, and a pair of bottom flanges 37 and 38. The top panel 34 is of rectangular shape, and the pair of side panels 35 and 36 are both bent right-angularly down from the opposite sides of the top panel. The pair of bottom flanges 37 and 38 are further bent right-angularly, and toward each other, from the bottom edges of the side panels 35 and 36.

As indicated also in FIG. 7, aside from the foregoing mechanical makeup thereof, the casing top part 20 may be functionally divided into a midportion 20a forming a part of the means defining the circuit chamber 18, and a pair of opposite end portions 20b and 20c forming parts of the means defining the air passageways 16 and 17, respectively. The portion 20a occupies most of the top panel 34, closing the open top of the body part 19. The rest of the casing top part 20 are the portions 20b and 20c.

The top panel 34 of the casing top part 20 provides the top 8 of the FIGS. 1–6 casing 2. The side-to-side dimension of the top panel 34 is therefore greater than that of the bottom panel 21 of the body part 19 and approximately equal to that of the front panel 22 of the body part. Clearance holes are formed at 39 through the top panel 34 for the passage of screws 30 as they are driven into the noted tapped holes 31 in the top flanges 28 and 29 on the partition panels 24 and 25 of the casing bottom part 19.

The pair of side panels 35 and 36 of the casing top part 20 form the pair of opposite sides 12 and 13 of the FIGS. 1–6 casing 2, or the outer walls of the air passageways 16 and 17. However, as clearly revealed by FIGS. 5 and 6 in particular, these side panels 35 and 36 are made somewhat greater in height than the pair of partition panels 24 and 25 of the casing bottom part 19, which are the inside walls of the air passageways 16 and 17, for reasons made apparent below.

The pair of bottom flanges 37 and 38 of the casing top part 20 form parts of the bottom 9 of the FIGS. 1–6 casing 2 and, specifically, the bottoms of the air passageways 16 and 17. However, with reference to FIGS. 5 and 6 again, the bottom flanges 37 and 38 are of greater width than the air passageways 16 and 17. The pair of side panels 35 and 36 of the casing top part 20 are made greater in height than the pair of partition panels 24 and 25 of the body part 19, as aforesaid, only to such an extent that when the body part and the cover part are assembled as in these figures, the pair of bottom flanges 37 and 38 come into underlapping relationship to the bottom panel 21 of the body part. Clearance holes are formed at 40 through the underlapping parts of the bottom flanges 37 and 38 for the passage of screws 32 as they are turned into the aforesaid tapped holes 33 in the bottom panel 21 of the casing bottom part 19.

It is now seen that the circuit chamber 18 is defined both by the bottom panel 21, part of the front panel 22, the rear panel 23, and the partition panels 24 and 25 of the casing bottom part 19 and by part of the top panel 34 of the casing top part 20. The air intake passageway 16 is defined both by the side panel 35, bottom flange 37, and part of the top panel 34, of the casing top part 20 and by the partition panel 24 and part of the front panel 22 of the casing bottom part 19. The exhaust passageway 17 is defined both by the side panel 36, bottom flange 38, and part of the top panel 34, of the casing top part 20 and by the partition panel 25 and part of the front panel 22 of the casing bottom part 19.

As depicted in phantom outline in FIG. 3, the cooling fan 4 comprises a set of revolving vanes 4a and an electric drive motor 4b. The fan 4 is to be mounted inside the lefthand partition panel 24 of the body part 19, and in alignment with the air inflow opening 26 therein, before the casing top part 20 is placed upon the casing bottom part. Also prior to the assemblage of the casing parts 19 and 20, the electric circuit means 3 may be mounted in position on the bottom panel 21 of the body part 19.

Then the casing bottom part 19 and casing top part 20 may be put together by inserting, the rear panel 23 foremost, the opposite lateral end portions of the casing bottom part into the spaces between the top panel 34 and bottom flanges 37 and 38 of the casing top part. Then screws 30 may be driven through the clearance holes 39 in the casing top part top panel 34 into the tapped holes 31 in the casing body part partition flanges 31, and screws 32 through the clearance holes 40 in the casing top part bottom flanges 37 and 38 into the tapped holes 33 in the casing bottom part bottom panel 21.

The assemblage of the instrument 1 is completed by turning only the total of eight screws 30 and 32, in this embodiment of the invention. It will be appreciated that the casing bottom part 19 and casing top part 20 are shaped in intercomplementary relationship to each other to define in combination not only the circuit chamber 18 but the pair of air passageways 16 and 17 as well. These three discrete spaces are automatically created simply as the two casing parts 19 and 20 are combined as above.

In use of the instrument 1 the fan 4 is to be driven in a direction for drawing air into the circuit chamber 18. The ambient air will be drawn into the intake passageway 16 through the intake port 14 at the back of the casing 2, thence into the circuit chamber 18 through the inflow opening 26 in the partition 24, thence into the exhaust passageway 17 through the outflow opening 27 in the partition 25, and out of the casing through the exhaust port 15 at the back of the casing. The cooling of the electric circuit means 3 is accomplished by the forced current of air through the circuit chamber 18.

The advantages gained by the foregoing embodiment of the invention may be recapitulated as follows:

1. With the fan 4 mounted inside the casing 2, and spaced a considerable distance away from the back 11 of the casing, the terminal pins 6 and receptacles 7 can be arranged as desired all over the back of the casing.

2. Thanks to the absence of the fan 4 from the casing back 11, and the presence of only the air intake port 14 and exhaust port 15, a sufficiently large area is secured on the casing back for the provision of a desired number of terminal pins 6 and receptacles 7, and in an arrangement convenient for connection of other instruments by the user.

3. The arrangement of the terminal pins 6 and receptacles 7 solely on the casing back 11 makes the instrument 1 esthetically appealing as seen from the front.

4. Less audible noise is produced by confining the fan 4 within the casing 2.

5. An ideal flow path of cooling air is defined within the casing by the pair of partitions 24 and 25 therein for most efficient cooling of the electric circuit means 3.

6. The division of the casing interior into the three spaces 16, 17 and 18 is accomplished by the combination of only the two casing parts 19 and 20.

7. The casing parts 19 and 20 are well designed for ease of fabrication and ease of assemblage.

Figure 8:
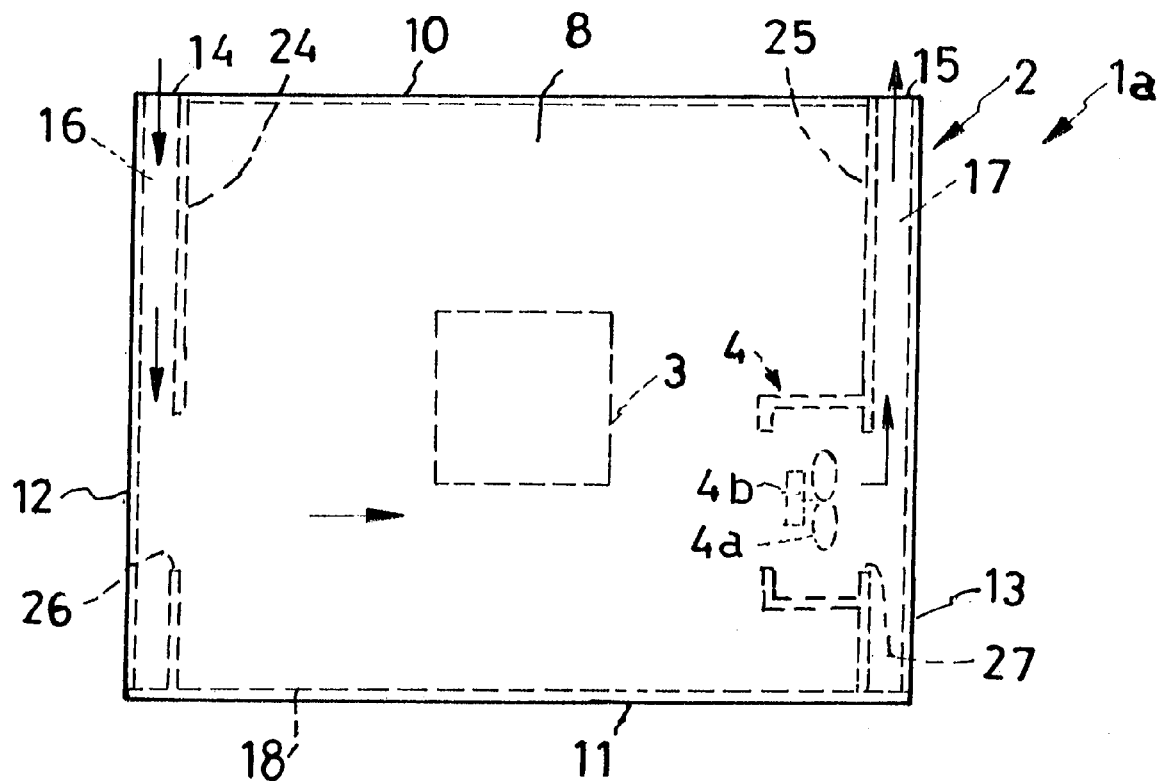
FIG. 8 is a view similar to FIG. 3 but showing an alternative embodiment of the invention.

The FIGS. 1–7 instrument 1 may be modified as shown in FIG. 8 and therein generally designated 1a. The modified instrument 1a has the casing 1 of exactly the same construction as that of the foregoing embodiment; only, the cooling fan 4 is mounted to the righthand partition 25, in a position just upstream of the exhaust opening 27 therein. The fan 4 is to be driven in a direction for exhausting the air from the circuit chamber 18 into the exhaust passageway 17. Fresh ambient air will be taken in through the intake port 14 into the intake passageway 16 and thence into the circuit chamber 18 through the inflow opening 26 in the partition 24, just as in the first disclosed embodiment.

Notwithstanding the foregoing detailed disclosure, it is not desired that the present invention be limited by the exact showing of the drawings or the description thereof. For example, the front ends of the air passageways 16 and 17 could be left open. Further the invention itself could be applied to a variety of electric instruments other than the exemplified audio system component. These and other modifications, alterations, or adaptations of the illustrated embodiments will suggest themselves to one skilled in the art without departure from the scope of the claims attached hereto.

What is claimed is:

1. A ventilated electric instrument comprising:
   (a) a casing bottom part substantially in the shape of an open-top box integrally comprising a bottom panel, a pair of opposite face panels, and a pair of opposite partition panels;
   (b) a casing top part substantially in the shape of an inverted U integrally comprising a top panel, which closes the open-top of the casing bottom part and which defines in combination therewith a circuit chamber between the pair of partition panels of the casing bottom part, and a pair of opposite side panels depending from the top panel to define in combination with the partition panels of the casing bottom part an air intake passageway and an exhaust passageway on opposite sides of the circuit chamber;
   (c) a fan mounted in the circuit chamber for causing airflow from the intake passageway to the exhaust passageway through the circuit chamber;
   (d) electric circuit means mounted in the circuit chamber and positioned to be cooled by the airflow; and
   (e) terminal means arranged on one of the face panels of the casing bottom part and electrically connected to the electric circuit means.

2. The ventilated electric instrument of claim 1 wherein the other face panel of the casing bottom part have portions extending beyond the partition panels for closing the intake passageway and the exhaust passageway.

3. The ventilated electric instrument of claim 1 wherein the casing top part further comprises a pair of flange panels formed respectively on the pair of side panels for forming the bottoms of the intake passageway and the exhaust passageway.

4. A ventilated electric instrument comprising:
   (a) a casing bottom part substantially in the shape of an open-top box integrally comprising a bottom panel, a pair of face panels erected from two opposite sides of the bottom panel, a pair of partition panels erected from two other opposite sides of the bottom panel, and a pair of top flanges formed one on each partition panel;
   (b) a casing top part substantially in the shape of an inverted U integrally comprising a top panel, which closes the open-top of the casing bottom part and which defines in combination therewith a circuit chamber between the pair of partition panels of the casing bottom part, a pair of opposite side panels depending from the top panel to define in combination with the partition panels of the casing bottom part an air intake passageway and an exhaust passageway on opposite sides of the circuit chamber, and a pair of bottom flanges formed one on each side panel to provide bottoms of the intake passageway and the exhaust passageway;
   (c) first fastener means for fastening the top panel of the casing top part to the pair of top flanges of the casing bottom part;
   (d) second fastener means for fastening the bottom flanges of the casing top part to the bottom panel of the casing bottom part;
   (e) a fan mounted in the circuit chamber for causing airflow from the intake passageway to the exhaust passageway through the circuit chamber;
   (f) electric circuit means mounted in the circuit chamber and positioned to be cooled by the airflow; and
   (g) terminal means arranged on one of the face panels of the casing bottom part and electrically connected to the electric circuit means.

5. The ventilated electric instrument of claim 4 wherein the other face panel of the casing bottom part have portions extending beyond the partition panels for closing the intake passageway and the exhaust passageway.

6. The ventilated electric instrument of claim 4 wherein the pair of bottom flanges of the casing top part are in underlapping relationship to the bottom panel of the casing bottom part.

* * * * *